United States Patent [19]

Egawa

[11] Patent Number: 5,668,406
[45] Date of Patent: Sep. 16, 1997

[54] SEMICONDUCTOR DEVICE HAVING SHIELDING STRUCTURE MADE OF ELECTRICALLY CONDUCTIVE PASTE

[75] Inventor: Hidenori Egawa, Tokyo, Japan

[73] Assignee: NEC Corporation, Tokyo, Japan

[21] Appl. No.: 767,635

[22] Filed: Dec. 17, 1996

Related U.S. Application Data

[63] Continuation of Ser. No. 455,997, May 31, 1995, abandoned.

[30] Foreign Application Priority Data

May 31, 1994 [JP] Japan .................. 6-119114

[51] Int. Cl.$^6$ .......... H01L 23/48; H01L 23/552; H01L 23/22; H05K 7/14
[52] U.S. Cl. .......... 257/690; 257/659; 257/660; 257/687; 361/800; 174/50.59
[58] Field of Search .......... 257/690, 691, 257/659, 660, 687, 788, 698; 361/799, 800

[56] References Cited

U.S. PATENT DOCUMENTS

| | | | |
|---|---|---|---|
| 4,680,617 | 7/1987 | Ross | 257/659 |
| 5,153,379 | 10/1992 | Guzuk et al. | 257/659 |
| 5,166,772 | 11/1992 | Soldner et al. | 257/659 |
| 5,466,893 | 11/1995 | Nakatani et al. | 174/261 |

FOREIGN PATENT DOCUMENTS

| | | | |
|---|---|---|---|
| 56-58249 | 5/1981 | Japan | 257/660 |
| 60-68638 | 4/1985 | Japan | 257/659 |
| 62-274735 | 11/1987 | Japan | 257/687 |
| 1-235356 | 8/1989 | Japan | 257/698 |
| 2-81460 | 8/1990 | Japan | 257/693 |
| 3-171652 | 7/1991 | Japan | 257/659 |
| 3-167868 | 7/1991 | Japan | 257/659 |
| 5-21655 | 1/1993 | Japan | 257/660 |
| 5-136291 | 1/1993 | Japan | 257/672 |

Primary Examiner—Mahshid D. Saadat
Assistant Examiner—Jhihan B. Clark
Attorney, Agent, or Firm—Young & Thompson

[57] ABSTRACT

Disclosed herein is a semiconductor device having shielded structure of an integrated circuit for improving the noise shielding characteristic. The semiconductor device comprises a wiring substrate 100, a recess 101 formed on one main surface of the wiring substrate 100, an IC chip 12 mounted on the recess 101, a resin 13 formed to cover the IC chip 12 and fill the recess 101, a conductive paste 14 formed on the resin 13, a GND pattern 18 formed on the other main surface of the wiring substrate 100, and a through hole 15 formed in the wiring substrate 100 for connecting the GND pattern 18 to the conductive paste 14 electrically.

12 Claims, 3 Drawing Sheets

SEMICONDUCTOR DEVICE HAVING SHIELDING STRUCTURE MADE OF ELECTRICALLY CONDUCTIVE PASTE

This application is a continuation of application Ser. No. 08/455,997, filed May 31, 1995, now abandoned.

BACKGROUND OF THE INVENTION

The present invention relates to a semiconductor device and, particularly to, an improvement in a semiconductor device having shielding layers provided on opposed surface of a package for encapsulating an (IC) chip.

In a semiconductor device, a shielding layer is employed for electrically and magnetically shielding an IC chip and is thus formed on each surface of a package opposed to each other. Such a device according to a prior art is shown in FIG. 4.

In FIG. 4, an IC chip 32 and a passive element chip 39 are mounted on a wiring substrate 31. The wiring substrate 31 is inserted into a resin case 30 and sealed with a sealing resin 33. A plurality of external leads 37 are provided with being connected to electrodes the wiring substrate 31 and protruded out of the sealing resin 33.

Moreover, a printed conductive pattern 34 serving as a shielding structure is formed on the top of the resin case 30. The printed conductive pattern 34 is connected with the ground (GND) line (not shown) by making an external lead wire 35 attach to the external lead 37 with a solder 36.

According to another prior art as shown in FIGS. 5(A) and 5(B), a wiring substrate 41 on which an IC chip 42 is mounted is entirely soaked in a facing sealing resin 43 and then dried. Thereafter a pin 48 connected to the GND pattern of the wiring substrate 41 is bent so as to contact the mounting surface and moreover soaked in a conductive paste 44 and then dried to form a shielded structure. One of the external leads 47 is connected to the GND, so that the pin 48 is also connected electrically to the GND.

Recently, there has been proposed a semiconductor device in which a part of the package is made of a part of the wiring substrate itself. In this device, the wiring substrate has a recess into which an IC chip is mounted on a bottom of the recess, and a resin is formed to fill the recess and cover the IC chip.

This device, however, has no conductive shield pattern. For this reason, the IC chip is sometimes affected electrically or magnetically by noise.

SUMMARY OF THE INVENTION

A primary object of the present invention is, therefore, to provide a shielding structure for a semiconductor device in which a part of the printed substrate itself constitutes a part of the package.

A semiconductor device according to the present invention comprises a wiring substrate having a recess on a first main surface and a first conductive pattern formed to cover a second main surface, an element mounted on the bottom of the recess, a sealing resin formed to cover the element and to fill the recess, a second conductive pattern formed on the first main surface to cover the sealing resin, and connection means for electrically connecting the first conductive pattern to the second conductive pattern.

With the construction as described above, the present invention makes it possible to form a shielding pattern for shielding the semiconductor chip. It is thus possible to relieve the interference due to noise radiated from the chip or from the outside.

BRIEF DESCRIPTION OF THE DRAWINGS

The above and other objects, advantages and features of the present invention will be more apparent form the following description taken in conjunction with the accompanying drawings, in which.

DETAILED DESCRIPTION TO THE PREFERRED EMBODIMENTS

Figure 1:
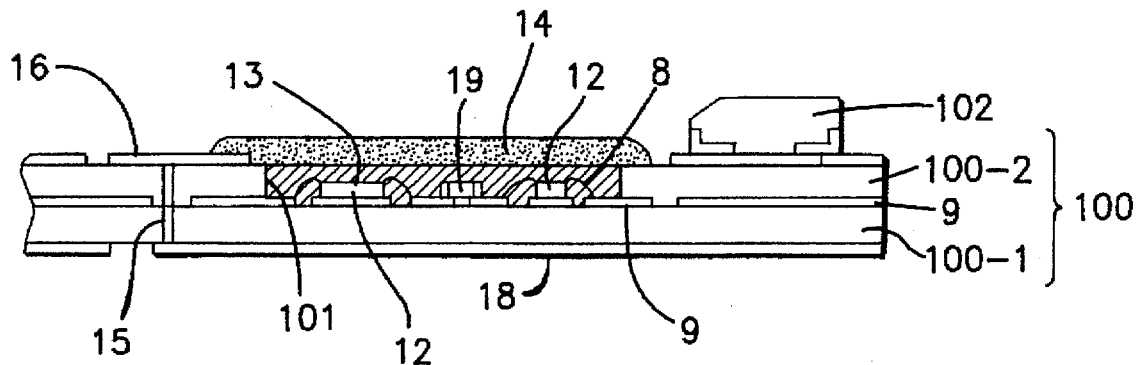
FIG. 1 is a sectional view of a semiconductor device of a first embodiment of the present invention.

Referring now to FIG. 1, a semiconductor device according to a first embodiment of the present invention is fabricated as a printed wiring board.

Specifically, IC chips 12 and a passive element 19 such as a capacitor or a resistor are mounted on respective mounting land patterns of internal conductor layers 9 on a recess 101 formed in a glass epoxy printed wiring board 100. The printed wiring board 100 is fabricated from a first and a second glass epoxy insulated board 100-1 and 100-2 and an internal conductor layers 9 formed between the first and the second glass epoxy insulated boards. The conductive layers 9 are thus formed as printed conductive patterns. The respective electrodes of the IC chips 12 are wire-bonded with the corresponding pads of the internal conductor layers 9 by respective bonding wires 8. In order to seal the chips 12 and the element 19, a sealing resin 13 is injected to fill the recess 101 such that the surface of the resin 13 fits the surface of the board 100 within a range of approx. ±0.2 mm. Thereafter, the injected sealing resin 13 dries. As a result, the surface of resin 13 and the surface of the printed wiring board 100 are made substantially even, as shown in FIG. 1.

Thereafter, an electrically conductive paste such as a Cu paste or an Ag paste is printed on the sealing resin 13 and the wiring substrate up to a thickness of 10 to 50 μm, in accordance with the present invention. The conductive paste is then hardened by drying it at 150° C. for approx. 30 min to form a printed conductive paste pattern 14. This pattern has an area covering a whole part of a sealed area by the sealing resin 13. If desired, the pattern 14 may have an area that is smaller more or less than the recess 101 covering the upper portion of the IC chips 12.

It is to be noted that, the shielding pattern 14 formed by the printed conductor paste is elongated to be attached to a GND pattern pad 16 formed on the main surface of the printed wiring board 100. The GND pattern pad 16 is connected to a back ground (GND) pattern 18 previously formed on the substantially whole back surface (the other main surface) of the printed wiring board 100 via a through-hole 15. Therefore, the printed wiring board 100 has shielding layers for the IC chips 12 on both the top surface and the back surface thereof.

In an electrical operation, the shielding pattern 14 is connected to a fixed potential (GND potential), so that noises generated from the chips 12 and from the outside are shielded.

It should be noted that, if the level difference (step) between the surface of the sealing resin 13 and that of the wiring substrate 100 exceeds ±0.5 mm, the printed conductive paste pattern 14 may not electrically be connected at this level difference portion to the GND pattern pad 16. Therefore, it is preferable to keep the level difference between both surfaces within ±0.5 mm.

Because the printed wiring board 100 of the first embodiment in FIG. 1 is a general printed wiring board with a large area capable of forming a circuit by mounting other elements and devices even on the outside of the recess sealed by a sealing resin, the shielding conductive paste pattern 14 is printed and thereafter a surface-mounting element 102 is mounted on the surface of the wiring substrate 100. Therefore, the noise radiated from the IC 12 is shielded by the conductive printed paste 14 and the back GND pattern paste 18.

Figure 2A:
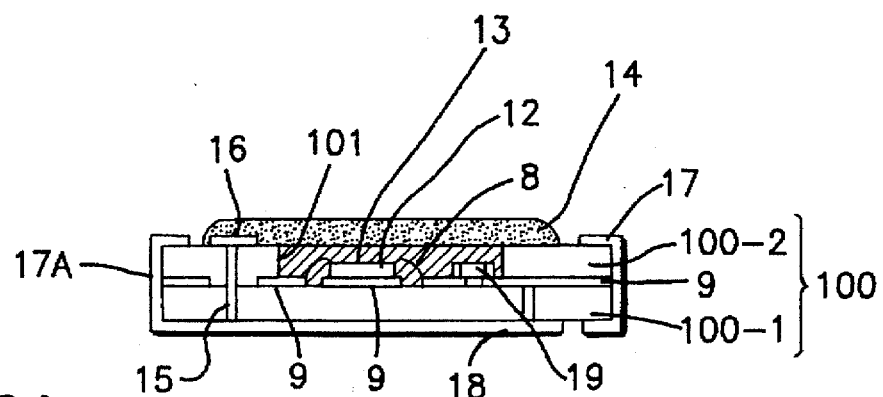
FIG. 2(A) is a sectional view of a semiconductor device of a second embodiment of the present invention.
Figure 2B:
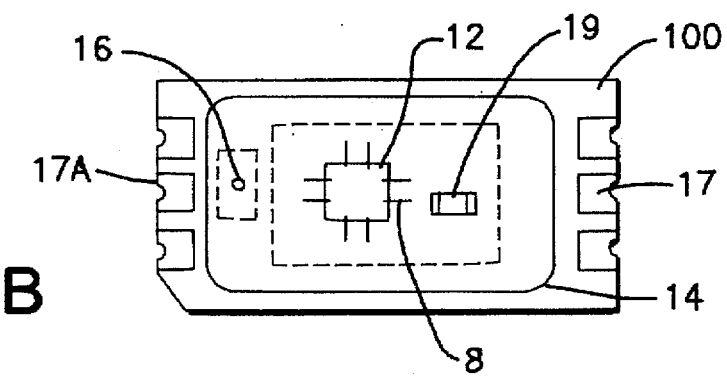
FIG. 2(B) is a top view of the semiconductor device of the second embodiment.

Turning to FIGS. 2(A) and 2(B), there are shown a second embodiment of the present invention applied to a semiconductor device package, in which the same constituents as those shown in FIG. 1 are denoted by the same reference numerals to omit the further description thereof. In this embodiment, a plurality of end electrode patterns 17 are formed on the both sides of the predetermined-shape glass epoxy wiring substrate 100 to provide a lead-less device. One of the electrodes 17 functions as a ground end-electrode 17A which is in turn connected to the back GND pattern 18. The semiconductor device package is mounted on a mother board (not shown) having many wiring patterns for transferring many signals to many elements. However, the noise radiating from the IC 12 is shielded by the conductive paste 14 and the back GND pattern 18. As a result, the noise does not interfere with many elements through many wiring patterns.

Figure 3A:
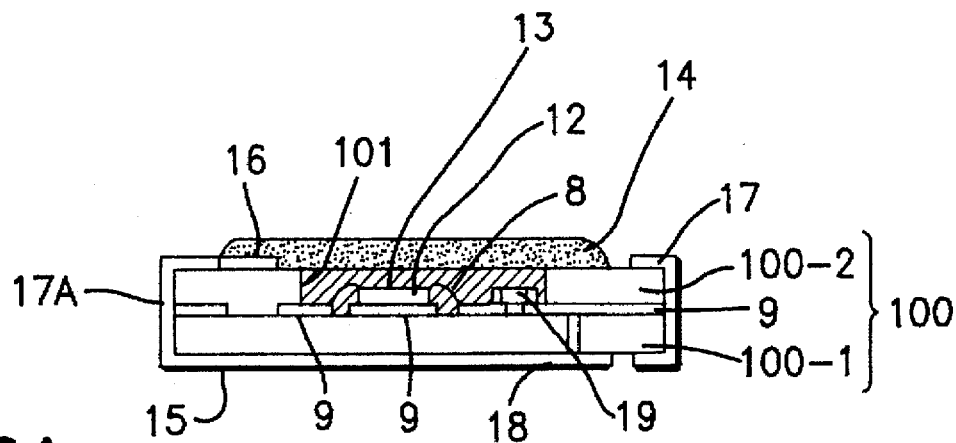
FIG. 3(A) is a sectional view of a semiconductor device of a third embodiment of the present invention.
Figure 3B:
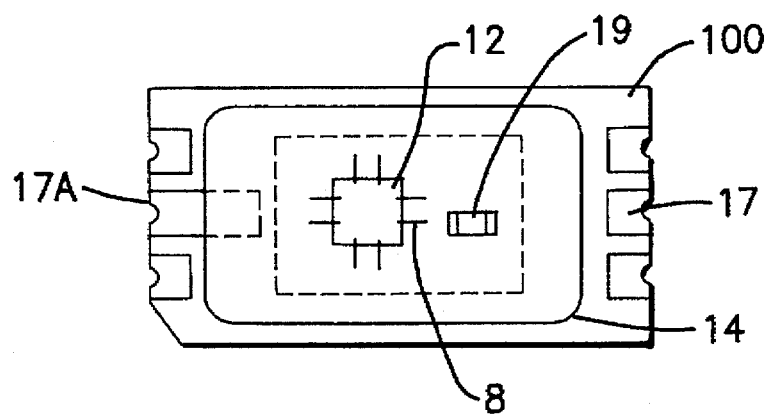
FIG. 3(B) is a top view of a semiconductor device of a third embodiment.
Figure 4:
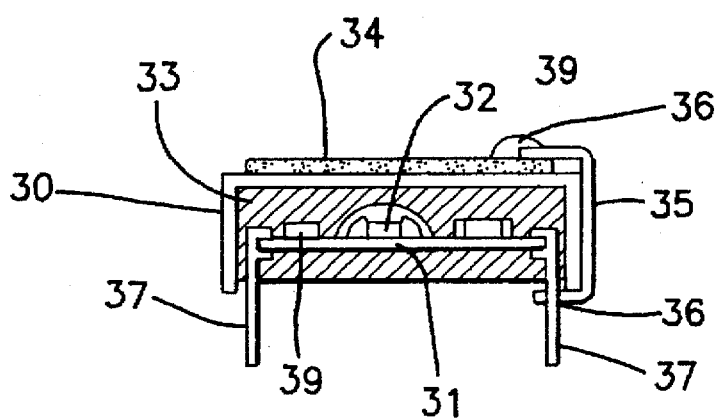
FIG. 4 is a sectional view of a conventional semiconductor device of a prior art.
Figure 5A:
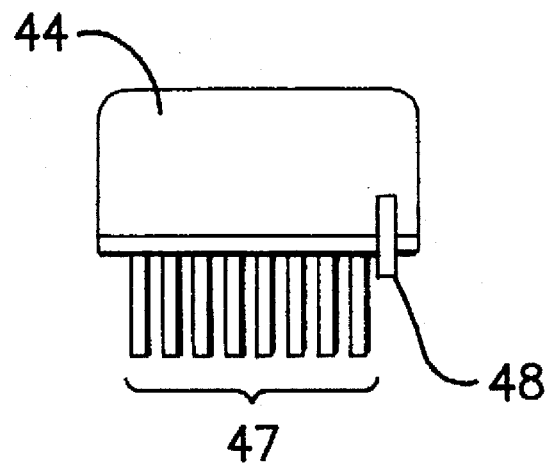
FIG. 5(A) is a top view of another conventional semiconductor device.
Figure 5B:
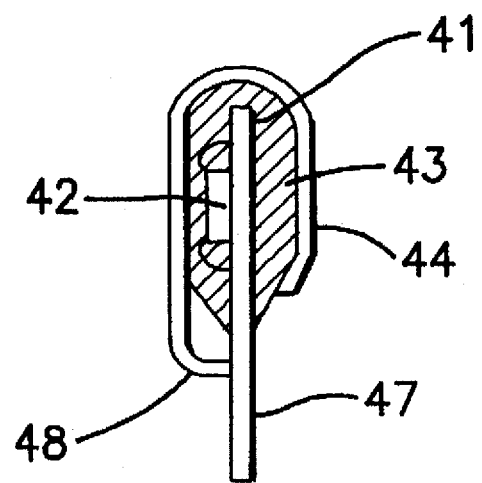
FIG. 5(B) is a sectional view of yet another semiconductor device.

FIGS. 3(A) and 3(B) show a third embodiment of the present invention. In this embodiment, the ground electrode 17A is expanded to form the ground pattern pad 16, so that the through-hole 15 (see FIGS. 1 and 2) as omitted. The third embodiment is the same as the first embodiment except for connecting the back GND pattern 18 to the back ground pad 16, using the ground end electrode 17A, as shown in FIG. 3(A).

Although, the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention. For example, it is preferable to form the printed conductive paste pattern 14 at both sides by forming the recess 101 at both sides of the substrate and repeating the above process when mounted parts are present at both sides.

Specifically, it is possible to reduce noise by 10 to 20 dB compared to a semiconductor device package without the shielded structure of the present invention.

What is claimed is:

1. A semiconductor device comprising:
   a wiring substrate having a recess formed on a first main surface of said wiring substrate;
   a first conductive pattern formed on said first main surface, and having a fixed potential;
   at least one element mounted on a bottom of said recess;
   a sealing resin formed to cover said element and fill said recess; and
   a conductive shielding pattern formed directly on and covering a surface area of said sealing resin covering said at least one element and electrically connected with said first conductive pattern.

2. The semiconductor device as claimed in claim 1, wherein a surface of said sealing resin is substantially even with said first main surface of said wiring substrate.

3. The semiconductor device as claimed in claim 1, wherein said conductive shielding pattern is formed by a printed conductive paste.

4. The semiconductor device as claimed in claim 1, further comprising:
   a second conductive pattern formed on a second main surface of said wiring substrate and having said fixed potential, said second main surface being formed on an opposite side of said first main surface of said wiring substrate; and
   connecting means for electrically connecting said first conductive pattern to said second conductive pattern.

5. The semiconductor device as claimed in claim 1, wherein said fixed potential is a background level.

6. The semiconductor device as claimed in claim 1, wherein said wiring substrate comprises a first insulating layer connected to a second insulating layer via an internal conductive layer formed selectively between said first and second insulating layer.

7. The semiconductor device as claimed in claim 2, wherein said conductive shielding pattern is formed on said substantially even surface.

8. The semiconductor device as claimed in claim 4, wherein said connecting means comprises a through hole formed into said wiring substrate to electrically connect said first conductive pattern to said second conductive pattern.

9. The semiconductor device as claimed in claim 4, wherein said second conductive pattern is formed on a substantially whole surface of said second main surface.

10. The semiconductor device as claimed in claim 4, wherein said second conductive pattern is elongated to cover a side surface formed between said first main surface and said second main surface of said wiring substrate.

11. The semiconductor device as claimed in claim 3, wherein said printed conductor paste formed of a material selected from the group including copper and silver.

12. The semiconductor device as claimed in claim 10, wherein said second conductive pattern elongated on said side surface connects to said first conductive pattern to form said connecting means.

* * * * *